United States Patent
Da Silva et al.

(10) Patent No.: US 11,808,805 B1
(45) Date of Patent: Nov. 7, 2023

(54) HETEROGENOUS VOLTAGE-BASED TESTING VIA ON-CHIP VOLTAGE REGULATOR CIRCUITS

(71) Applicant: NVIDIA CORPORATION, Santa Clara, CA (US)

(72) Inventors: Francisco Da Silva, Morgan Hill, CA (US); Li-Wei Ko, Taipei (TW); Shang-Ju Lee, Banqiao Dist. (TW); Shyh-Horng Lin, Taipei (TW)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/875,260

(22) Filed: Jul. 27, 2022

(51) Int. Cl.
G01R 31/28 (2006.01)

(52) U.S. Cl.
CPC ..... *G01R 31/2853* (2013.01); *G01R 31/2879* (2013.01); *G01R 31/2884* (2013.01)

(58) Field of Classification Search
CPC ............ G01R 31/2853; G01R 31/2879; G01R 31/2884
USPC .................................. 324/750.01, 537, 500
See application file for complete search history.

(56) References Cited

U.S. PATENT DOCUMENTS

| | | | |
|---|---|---|---|
| 2021/0215754 A1* | 7/2021 | Sunder | G01R 31/2853 |
| 2022/0057447 A1* | 2/2022 | Hong | H01L 22/32 |
| 2023/0160954 A1* | 5/2023 | Hsieh | G01R 31/3004 |
| | | | 324/750.01 |

OTHER PUBLICATIONS

"Automated Test Equipment", Semiconductor Digest, Obtained Jun. 2, 2022, pp. 1-2. https://sst.semiconductor-digest.com/2016/01/automated-test-equipment/.

"Power Definitions". Semiconductor Engineering, Obtained Jun. 2, 2022. pp. 1-3. https://semiengineering.com/knowledge_centers/low-power/power-definitions/.

* cited by examiner

*Primary Examiner* — Giovanni Astacio-Oquendo
(74) *Attorney, Agent, or Firm* — Artegis Law Group, LLP

(57) ABSTRACT

One embodiment of the present invention sets forth an integrated circuit. The integrated circuit includes a plurality of subunits associated with a plurality of operating voltages. The integrated circuit also includes one or more voltage regulator circuits that convert a first input voltage into a first plurality of output voltages during a first test, wherein the plurality of output voltages is delivered to the plurality of subunits via a plurality of output channels.

20 Claims, 6 Drawing Sheets

US 11,808,805 B1

HETEROGENOUS VOLTAGE-BASED TESTING VIA ON-CHIP VOLTAGE REGULATOR CIRCUITS

BACKGROUND

Field of the Various Embodiments

Embodiments of the present disclosure relate generally to electronics and testing for defects in integrated circuits and, more specifically, to heterogenous voltage-based testing via on-chip regulating circuits.

Description of the Related Art

Advances in semiconductor manufacturing have reduced the sizes and increased the densities of transistors and other physical features within integrated circuits (also referred to herein as "chips"). As a result of these innovations, increasingly complex functionality can be incorporated into integrated circuit designs. In this regard, more complex functionality can be implemented across multiple discrete subunits within a single, overarching integrated circuit. For example, a single chip can be partitioned into multiple heterogeneous subunits, where each subunit implements functionality associated with a central processing unit (CPU), a graphics processing unit (GPU), a field programmable gate arrays (FPGA), a memory unit, an artificial intelligence (AI) accelerator, an interfaces, or some other type of integrated circuit.

A problem commonly seen with increasingly complex chips, though, is that, the increased variability in small semiconductor features and the conditions under which semiconductor devices are operated can lead to defects that cause degradation, malfunction, or failure. For example, variations in process, voltage and temperature (PVT) conditions and/or the aging of a chip can cause reduced performance and/or faults in various subunits within the chip.

To reduce the likelihood of such degradation, malfunction, or failure, manufactured chips are typically tested before the chips are installed in larger devices or shipped to customers. For example, automatic test equipment (ATE) is oftentimes used to test recently manufactured chips for functional defects by applying various test patterns to the chip. While the test patterns are applied to the chip, the ATE measures or collects voltages, currents, clock frequencies, temperatures, waveforms, and/or other conditions on the chip. Test results associated with the data collected by the ATE could be examined to detect defects in the chip and/or to verify that the chip meets specifications.

One drawback to using conventional ATEs to test chips is that the number of subunits on a chip oftentimes exceeds the number of power pins on the ATE used to deliver power to the chip. For example, an ATE could include a dozen power pins, while a chip that is tested using the ATE could include multiple dozens of subunits. In such situations, at least some of the power pins on the ATE are configured to individually supply power to a set of multiple subunits on the chip. Continuing with the above example, each of the dozen power pins on the ATE could be used to supply power to several subunits on the chip. Because each power pin is able to supply only one input voltage at a time to a corresponding set of subunits and the input voltage cannot fall outside the range of allowed operating voltages for any of the subunits within the set, voltage-based testing for the set of subunits is limited to a range of voltages that is bounded by the highest minimum operating voltage across the set of subunits and the lowest maximum operating voltage across the set of subunits. Consequently, the voltage-based testing implemented via the ATE is unable to detect defects within a set of subunits powered by the same power pin on the ATE when the defects are associated with operating voltages that are lower than the highest minimum operating voltage across the set of subunits and/or operating voltages that are higher than the lowest maximum operating voltage across the set of subunits.

As the foregoing illustrates, what is needed in the art are more effective techniques for testing integrated circuits.

SUMMARY

One embodiment of the present invention sets forth an integrated circuit. The integrated circuit includes a plurality of subunits associated with a plurality of operating voltages. The integrated circuit also includes one or more voltage regulator circuits that convert a first input voltage into a first plurality of output voltages during a first test, where the plurality of output voltages is delivered to the plurality of subunits via a plurality of output channels.

One technical advantage of the disclosed techniques relative to the prior art is that, with the disclosed techniques, a single input test voltage can be converted into multiple output test voltages that are then supplied to multiple subunits within a chip when testing the chip. Notably, the output test voltages can be structured such that the entire range of operating voltages for each subunit within the chip can be tested. Accordingly, the disclosed techniques enable a broader range of defects across the different subunits within a chip to be detected during testing, relative to what can be achieved using prior art approaches. Consequently, the broader-based testing enabled by the disclosed techniques is able to reduce the degradation and failure rates in chips that pass voltage-based tests. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
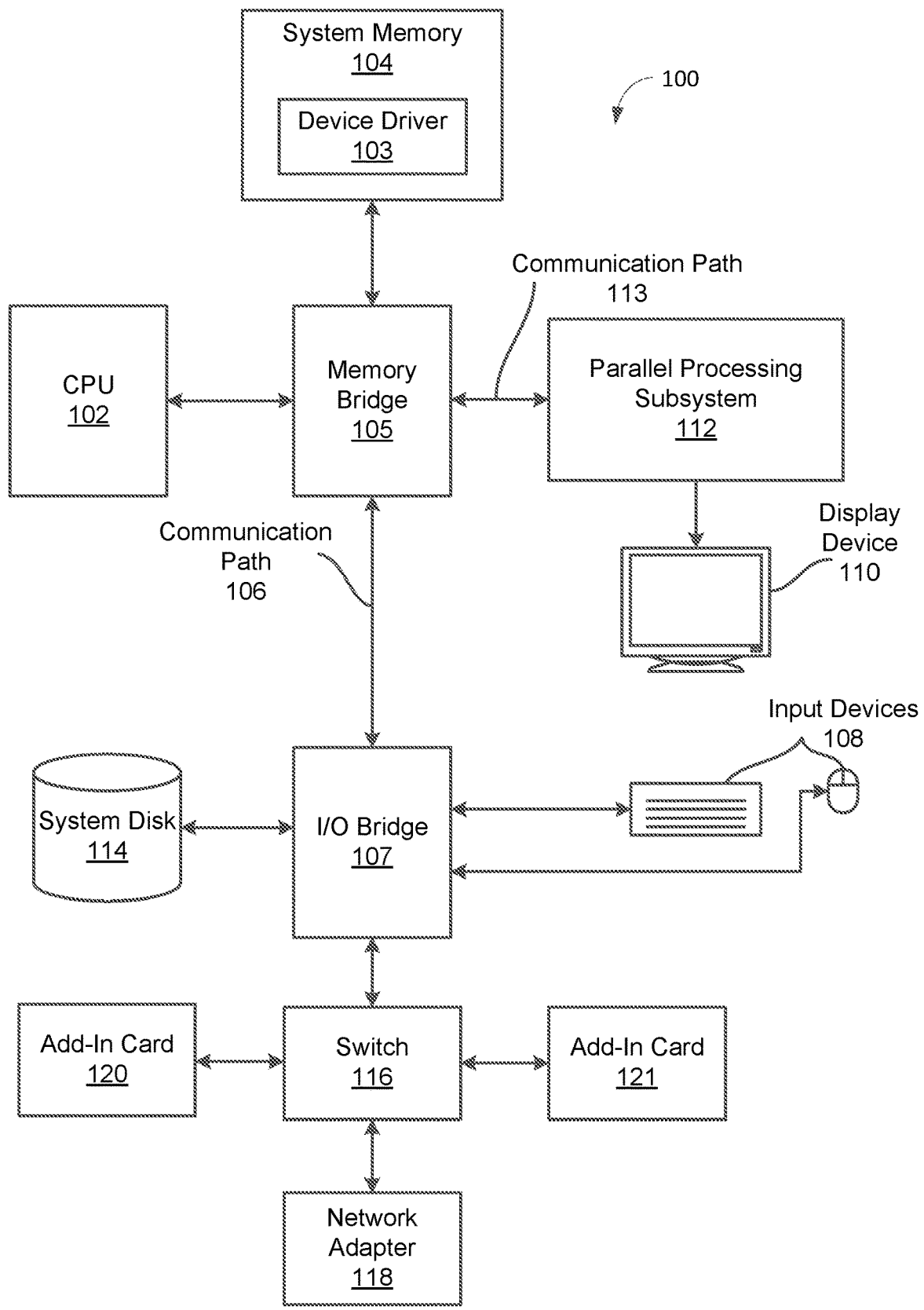
FIG. 1 illustrates a system configured to implement one or more aspects of the various embodiments.

In the following description, numerous specific details are set forth to provide a more thorough understanding of the various embodiments. However, it will be apparent to one of skill in the art that the inventive concepts may be practiced without one or more of these specific details.

General Overview

Computing devices such as personal computers, laptop computers, servers, workstations, mobile phones, tablets, game consoles, and/or smartwatches include discrete semiconductor devices that provide different types of functionality within the computing devices. For example, a central processing unit (CPU) could execute instructions that implement an operating system and/or one or more applications on a computing device. A graphics processing unit (GPU) in the computing device could perform specialized operations related to computer graphics, image processing, machine learning, linear algebra, statistics, and/or other types of parallel processing. These instructions and data processed via the instructions could additionally be stored in memory and/or one or more disk drives and transferred to the CPU or GPU via one or more bridges or buses.

Advances in semiconductor manufacturing have reduced the sizes and increased the densities of transistors and other physical features on semiconductor devices. As a result of these innovations, modern chip designs often include multiple smaller subunits that implement functionality associated with different semiconductor devices on a single chip. For example, a single chip could be partitioned into multiple heterogeneous logic blocks or chiplets that function as central processing units (CPUs), graphics processing units (CPUs), field programmable gate arrays (FPGAs), memory units, artificial intelligence (AI) accelerators, interfaces, and/or other types of integrated circuits.

However, increasing variability in small semiconductor features and the non-deterministic operation of semiconductor devices can lead to defects that cause degradation, malfunction, or failure. For example, aging of a chip and/or variations in process, voltage and temperature (PVT) conditions can cause reduced performance and/or faults in various components of the chips.

To reduce the likelihood of such degradation, malfunction, or failure, manufactured chips are tested to ensure that the chips operate correctly and/or meet specifications. For example, automatic test equipment (ATE) could be used to test a recently manufactured chip for functional defects by applying various test patterns to the chip. These test patterns could be used to apply and/or measure voltages, currents, clock frequencies, temperatures, waveforms, and/or other conditions at various pins on the chip. Test results collected by the ATE could be examined to detect defects in the chip and/or to verify that the chip meets specifications.

One drawback to using conventional ATEs to test chips is that the number of subunits on a chip oftentimes exceeds the number of power pins on the ATE used to deliver power to the chip. For example, an ATE could include a dozen power pins, while a chip that is tested using the ATE could include multiple dozens of subunits. In such situations, at least some of the power pins on the ATE are configured to individually supply power to a set of multiple subunits on the chip. Continuing with the above example, each of the dozen power pins on the ATE could be used to supply power to several subunits on the chip. Because each power pin is able to supply only one input voltage at a time to a corresponding set of subunits and the input voltage cannot fall outside the range of allowed operating voltages for any of the subunits within the set, voltage-based testing for the set of subunits is limited to a range of voltages that is bounded by the highest minimum operating voltage across the set of subunits and the lowest maximum operating voltage across the set of subunits. Consequently, the voltage-based testing implemented via the ATE is unable to detect defects within a set of subunits powered by the same power pin on the ATE when the defects are associated with operating voltages that are lower than the highest minimum operating voltage across the set of subunits and/or operating voltages that are higher than the lowest maximum operating voltage across the set of subunits.

To improve coverage of faults or defects during testing of chips with multiple subunits, each chip includes one or more voltage regulator circuits that convert an input voltage into multiple output voltages. These output voltages are delivered to multiple subunits in the chip to test the operation of the subunits under the corresponding ranges of operating voltages. For example, a chip could include one or more voltage regulator circuits that can be configured to operate in a test mode or in a bypass mode. During the test mode, each voltage regulator circuit could be used to convert a single input voltage supplied from a power pin on an ATE into minimum operating voltages and/or maximum operating voltages associated with a group of subunits that receive power from the power pin. The operation of the subunits under the minimum and maximum operating voltages could also be monitored by the ATE, thereby increasing the likelihood with which faults or defects in the subunit are detected during testing of the chip. After the chip is verified to meet specifications, the voltage regulator circuit(s) could be placed in the bypass mode to disable the operation of the voltage regulator circuit(s) (e.g., during subsequent packaging, assembly, or use of the chip).

System Overview

FIG. 1 is a block diagram illustrating a computer system 100 configured to implement one or more aspects of various embodiments. In some embodiments, computer system 100 is a machine or processing node operating in a data center, cluster, or cloud computing environment that provides scalable computing resources (optionally as a service) over a network.

In various embodiments, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In one embodiment, I/O bridge 107 is configured to receive user input information from optional input devices 108, such as a keyboard or a mouse, and forward the input information to CPU 102 for processing via communication path 106 and memory bridge 105. In some embodiments, computer system 100 may be a server machine in a cloud computing environment. In such embodiments, computer system 100 may not have input devices 108. Instead, computer system 100 may receive equivalent input information by receiving commands in the form of messages transmitted over a network and received via the network adapter 118. In one embodiment, switch 116 is configured to provide connections between I/O bridge 107 and other components of the computer system 100, such as a network adapter 118 and various add-in cards 120 and 121.

In one embodiment, I/O bridge 107 is coupled to a system disk 114 that may be configured to store content and applications and data for use by CPU 102 and parallel processing subsystem 112. In one embodiment, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. In various embodiments, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 includes a graphics subsystem that delivers pixels to an optional display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in conjunction with FIG. 2, such circuitry may be incorporated across one or more parallel processing units (PPUs), also referred to herein as parallel processors, included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

In one embodiment, CPU 102 is the master processor of computer system 100, controlling and coordinating operations of other system components. In one embodiment, CPU 102 issues commands that control the operation of PPUs. In some embodiments, communication path 113 is a PCI Express link, in which dedicated lanes are allocated to each PPU, as is known in the art. Other communication paths may also be used. PPU advantageously implements a highly parallel processing architecture. A PPU may be provided with any amount of local parallel processing memory (PP memory).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other embodiments, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
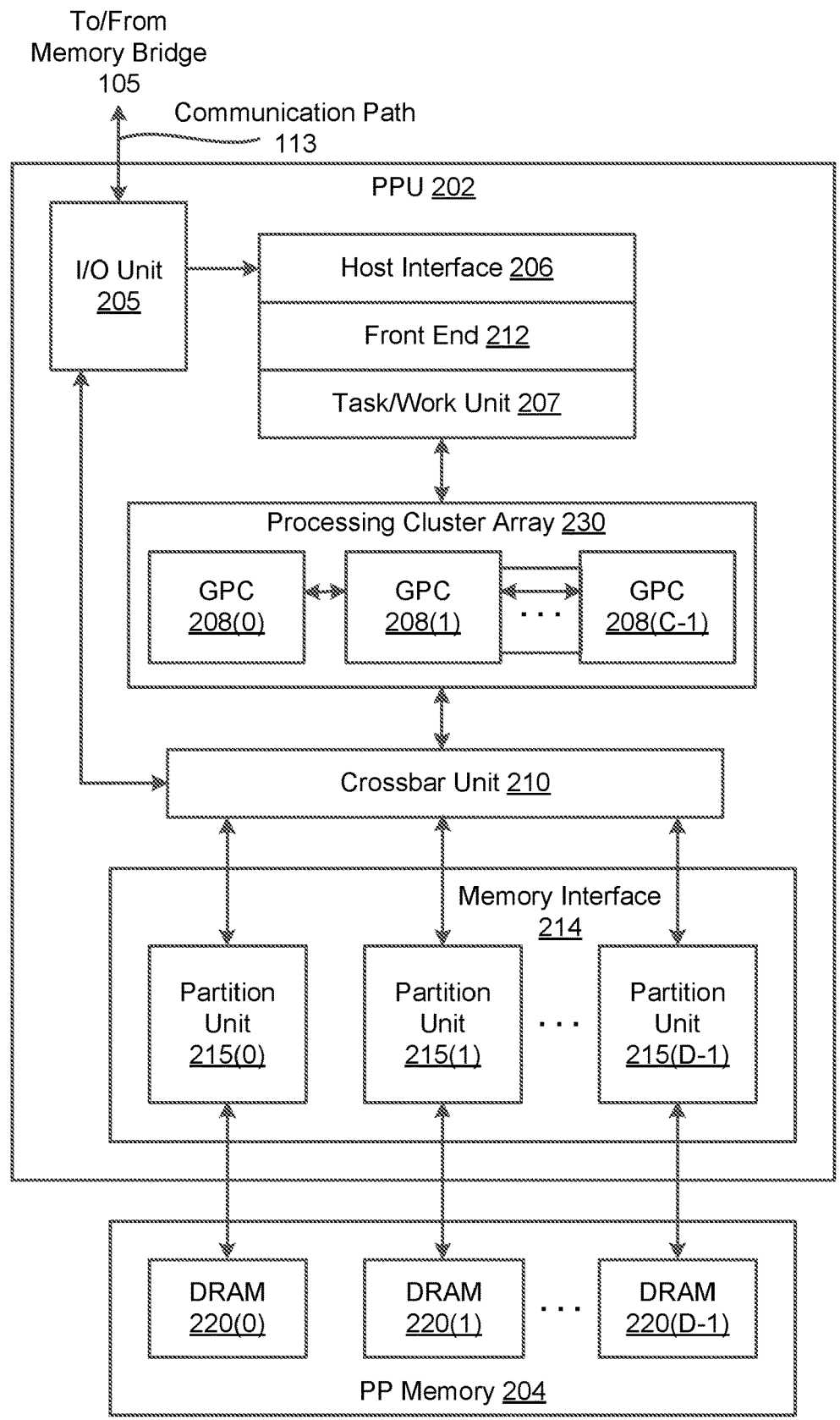
FIG. 2 is a block diagram of a parallel processing unit (PPU) included in the parallel processing subsystem of FIG. 1, according to various embodiments.

FIG. 2 is a block diagram of a parallel processing unit (PPU) 202 included in the parallel processing subsystem 112 of FIG. 1, according to various embodiments. Although FIG. 2 depicts one PPU 202, as indicated above, parallel processing subsystem 112 can include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 includes a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to an optional display device 110 for display. In some embodiments, PPU 202 also may be configured for general-purpose processing and compute operations. In some embodiments, computer system 100 may be a server machine in a cloud computing environment. In such embodiments, computer system 100 may not have a display device 110. Instead, computer system 100 may generate equivalent output information by transmitting commands in the form of messages over a network via the network adapter 118.

As mentioned above, CPU 102 can operate as a master processor that controls and coordinates operations of other system components in computer system 100. In one embodiment, CPU 102 issues commands that control the operation of PPU 202. For example, CPU 102 could write a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a command queue, also referred to herein as a pushbuffer, to initiate processing of the stream of commands in the data structure. In one embodiment, the PPU 202 reads command streams from the command queue and then executes commands asynchronously relative to the operation of CPU 102. In embodiments where multiple pushbuffers are generated, execution priorities may be specified for each pushbuffer by an application program via device driver to control scheduling of the different pushbuffers.

In one embodiment, PPU 202 includes an I/O (input/output) unit 205 that communicates with the rest of computer system 100 via the communication path 113 and memory bridge 105. In one embodiment, I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. In one embodiment, host interface 206 reads each command queue and transmits the command stream stored in the command queue to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system of chip (SoC).

In one embodiment, front end 212 transmits processing tasks received from host interface 206 to a work distribution unit (not shown) within task/work unit 207. In one embodiment, the work distribution unit receives pointers to processing tasks that are encoded as task metadata (TMD) and stored in memory. The pointers to TMDs are included in a command stream that is stored as a command queue and received by front end 212 from the host interface 206. Processing tasks that may be encoded as TMDs include indices associated with the data to be processed as well as state parameters and commands that define how the data is to be processed. For example, the state parameters and commands could define the program to be executed on the data. Also for example, the TMD could specify the number and configuration of the set of CTAs. Generally, each TMD corresponds to one task. The task/work unit 207 receives tasks from the front end 212 and ensures that general processing clusters GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

In one embodiment, PPU 202 implements a highly parallel processing architecture based on a processing cluster array 230 that includes a set of C general processing clusters (GPCs) 208, where $C \geq 1$. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D partition units 215, where $D \geq 1$. Each partition unit 215 is coupled to one or more dynamic random access memories (DRAMs) 220 residing within PP memory 204. In some embodiments, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

In one embodiment, a given GPC 208 may process data to be written to any of the DRAMs 220 within PP memory 204. In one embodiment, crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In some embodiments, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

In one embodiment, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

Any number of PPUs 202 may be included in parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

In one or more embodiments, various components of the systems of FIGS. 1-2 are implemented using integrated circuits that include multiple subunits. These components include (but are not limited to) CPU 102, system memory 104, memory bridge 105, I/O bridge, switch 116, add-in cards 120-121, network adapter 118, parallel processing subsystem 112, PPU 202, and/or PP memory 204. For example, a single chip could be partitioned into multiple heterogeneous logic blocks and/or chiplets that implement functionality associated with various components illustrated in FIGS. 1-2. Each logic block and/or chiplet could correspond to a separate integrated circuit that implements a well-defined subset of functionality within a larger package. In another example, multiple wafers or dies that include these components could be assembled into a three-dimensional integrated circuit (3D IC). In a third example, multiple components in the systems of FIGS. 1-2 could be integrated into a single package within a multi-chip module (MCM).

In some embodiments, each integrated circuit that includes multiple subunits also includes one or more voltage regulator circuits, or voltage regulators. Each voltage regulator circuit converts a potentially varying input voltage into one or more fixed output voltages. As described in further detail below, the multiple output voltages generated by the voltage regulator circuit(s) improve the coverage of defects or faults during testing of the integrated circuit. For example, the voltage regulator circuit(s) could be used to convert an input voltage from a single power pin on automatic test equipment (ATE) into multiple minimum and/or maximum operating voltages associated with a group of subunits. Consequently, the voltage regulator circuit(s) would allow defects to be detected in subunits within the group when the defects occur under operating voltages that are lower the highest minimum operating voltage in the group and under operating voltages that are higher than the lowest maximum operating voltage in the group.

Heterogeneous Voltage-Based Testing via On-Chip Voltage Regulator Circuits

Figure 3:
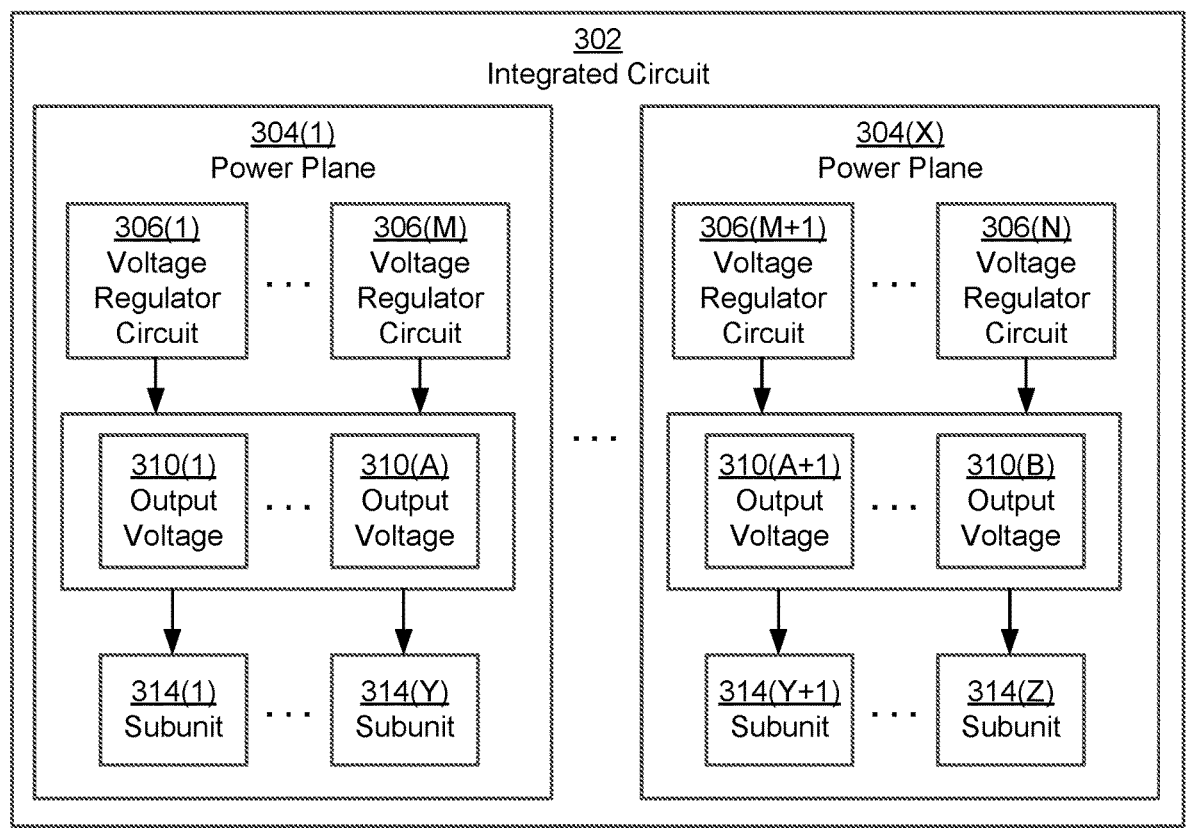
FIG. 3 illustrates an integrated circuit that can be included in the system of FIG. 1 and/or the parallel processing unit of FIG. 2, according to various embodiments.

FIG. 3 illustrates an integrated circuit 302 that can be included the system of FIG. 1 and/or the parallel processing unit of FIG. 2, according to various embodiments. As mentioned above, integrated circuit 302 can include a single chip with multiple heterogeneous logic blocks and/or chiplets, a 3D IC that includes multiple stacked wafers or dies, a multi-chip module, and/or another form factor that incorporates multiple discrete subunits (e.g., subunits 314(1)-(Y) and subunits 314 (Y+1)-(Z), each of which is referred to individually as subunit 314) into a single package or assembly.

Within integrated circuit 302, subunits 314 implement functionality associated with various types of discrete semiconductor components. For example, subunits 314 could provide functionality associated with CPUs, PPUs, GPUs, memory units, storage devices, switches, I/O bridges, field programmable gate arrays (FPGAs), artificial intelligence (AI) accelerators, interfaces, digital signal processors, and/or other types of integrated circuits.

Integrated circuit 302 includes one or more power planes 304(1)-(X), each of which is referred to individually as power plane 304. Each power plane 304 supplies an input voltage to a separate group of subunits 314. More specifically, power plane 304(1) supplies an input voltage to subunits 314(1)-(Y), and power plane 304(X) supplies a separate input voltage to subunits 314(Y+1)-(Z).

In some embodiments, power from one or more power planes 304 is supplied by an ATE that is used to test integrated circuit 302. For example, integrated circuit 302 could include one or more power planes 304 that are individually connected to different power pins in the ATE. Each of these power planes 304 would supply an input voltage and/or current from the corresponding power pin in the ATE to a different group of subunits 314 in integrated circuit 302.

Integrated circuit 302 can also, or instead, include one or more power planes 304 that are not directly connected to power pins in the ATE. For example, integrated circuit 302 could include a hierarchy of "stacked" power planes 304. One or more power planes 304 at the highest level of the hierarchy could be connected directly to one or more power pins in the ATE, and one or more power planes 304 at lower levels of the hierarchy could receive power from other components within integrated circuit 302. Hierarchies of power planes 304 and components in integrated circuit 302 are described in further detail below with respect to FIGS. 4A-4B.

Integrated circuit 302 also includes one or more voltage regulator circuits (e.g., voltage regulator circuits 306(1)-(M) and voltage regulator circuits 306(M+1)-(N), each of which is referred to individually as voltage regulator circuit 306) between power planes 304 and subunits 314. In particular, voltage regulator circuits 306(1)-(M) connect power plane 304(1) to subunits 314(1)-(Y), and voltage regulator circuits 306(M+1)-(N) connect power plane 304(X) to subunits 314(Y+1)-(Z).

Each voltage regulator circuit 306 converts an input voltage from the corresponding power plane 304 into one or more output voltages (e.g., output voltages 310(1)-(A) and output voltages 310(A+1)-(B), each of which is referred to individually as output voltage 310). As shown in FIG. 3, voltage regulator circuits 306(1)-(M) convert an input voltage received via power plane 304(1) into output voltages 310(1)-(A), and voltage regulator circuits 306(M+1)-(N) convert an input voltage received via power plane 304(X) into output voltages 310(A+1)-(B).

One or more output voltages 310 generated by each voltage regulator circuit 306 are supplied to one or more subunits 314 grouped under the same power plane 304. More specifically, output voltages 310(1)-(A) generated by voltage regulator circuits 306(1)-(M) from the input voltage delivered via power plane 304(1) are supplied to subunits 314(1)-(Y), and output voltages 310(A+1)-(B) generated by voltage regulator circuits 306(M+1)-(N) from the input voltage delivered via power plane 304(X) are supplied to subunits 314 (Y+1)-(Z). Each output voltage 310 generated by a given voltage regulator circuit 306 is delivered to a corresponding subunit 314 via an output channel from that voltage regulator circuit 306.

In one or more embodiments, output voltages 310 generated by voltage regulator circuits 306 include a range of operating voltages associated with subunits 314. For example, each voltage regulator circuit 306 could convert an input voltage received from a corresponding power plane 304 into one or more output voltages 310 that correspond to minimum operating voltages for one or more subunits 314 connected to the voltage regulator circuit. Each voltage regulator circuit 306 could also, or instead, convert an input voltages received from a corresponding power plane 304 into one or more output voltages 310 that correspond to maximum operating voltages for one or more subunits 314 connected to the voltage regulator circuit. Each voltage regulator circuit 306 could also, or instead, convert an input voltage received from a corresponding power plane 304 into one or more output voltages 310 that correspond to any operating voltages between the minimum operating voltage and maximum operating voltage for one or more subunits 314 connected to the voltage regulator circuit.

Each voltage regulator circuit 306 can additionally be configured to distribute the same output voltage 310 to all subunits 314 coupled to the output channels of the voltage regulator circuit. More specifically, each voltage regulator circuit 306 can be configured to operate in a test mode or in a bypass mode. When a given voltage regulator circuit 306 operates in the test mode, one or more output voltages 310 generated by the voltage regulator circuit from an input voltage are supplied to the corresponding subunits 314. When a given voltage regulator circuit 306 operates in the bypass mode, one or more components in that voltage regulator circuit 306 forwards an input voltage received via a corresponding power plane 304 as one or more output voltages 310 to one or more subunits 314 associated with that power plane 304. The test mode can be used to perform voltage-based testing of subunits 314, and the bypass mode can be used during normal operation and/or other types of testing of integrated circuit 302. The operation of voltage regulator circuits 306 and the implementation of the test mode and bypass mode in voltage regulator circuits 306 are described in further detail below with respect to FIGS. 5A-5B.

Figure 4A:
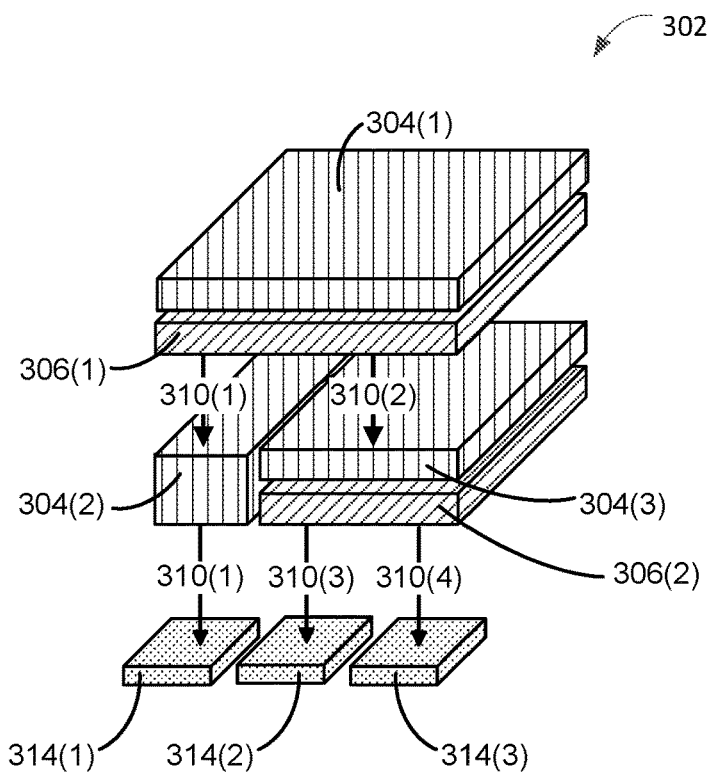
FIG. 4A illustrates an exemplar layout for the integrated circuit of FIG. 3, according to various embodiments.

FIG. 4A illustrates an exemplar layout for integrated circuit 302 of FIG. 3, according to various embodiments. As shown in FIG. 4A, the layout includes a hierarchy of three power planes 304(1)-(3). One power plane 304(1) is at the highest level of the hierarchy and receives power from a power pin on an ATE and/or another power source that is external to integrated circuit 302. The other two power planes 304(2)-(3) are lower in the hierarchy and receive power from other components within integrated circuit 302.

More specifically, a first voltage regulator circuit 306(1) receives an input voltage from power plane 304(1) and generates two output voltages 310(1)-(2). The first output voltage 310(1) is supplied to one power plane 304(2) via a first output channel of voltage regulator circuit 306(1) and subsequently propagated to a subunit 314(1) coupled to power plane 304(2).

The second output voltage 310(2) is supplied to another power plane 304(3) via a second output channel of voltage regulator circuit 306(1). A second voltage regulator circuit 306(2) receives output voltage 310(2) from power plane 304(3) and converts output voltage 310(2) into two more output voltages 310(3)-(4). Output voltage 310(3) is supplied to a subunit 314(2) connected to one output channel of the second voltage regulator circuit 306(2), and another output voltage 310(4) is supplied to a subunit 314(3) connected to another output channel of the second voltage regulator circuit 306(2).

Figure 4B:
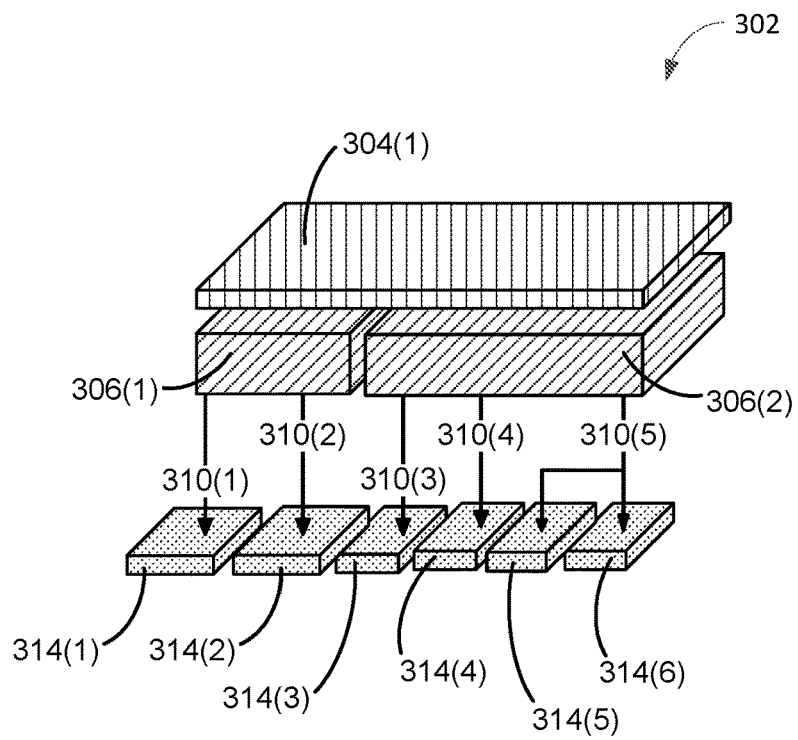
FIG. 4B illustrates an exemplar layout for the integrated circuit of FIG. 3, according to various other embodiments.

FIG. 4B illustrates an exemplar layout for integrated circuit 302 of FIG. 3, according to various embodiments. As shown in FIG. 4B, the layout includes a single power plane 304(1) that receives power from a power pin on an ATE and/or another power source that is external to integrated circuit 302. The layout also includes two voltage regulator circuits 306(1)-(2) that receive an input voltage from power plane 304(1).

Voltage regulator circuit 306(1) converts the input voltage from power plane 304(1) into two output voltages 310(1)-(2). Output voltage 310(1) is supplied via a first output channel of voltage regulator circuit 306(1) to a first subunit 314(1). Output voltage 310(2) is supplied via a second output channel of voltage regulator circuit 306(1) to a second subunit 314(2).

Voltage regulator circuit 306(2) converts the input voltage from power plane 304(1) into three output voltages 310(3)-(5). Output voltage 310(3) is supplied via a first output channel of voltage regulator circuit 306(2) to a third subunit 314(3). Output voltage 310(4) is supplied via a second output channel of voltage regulator circuit 306(2) to a fourth subunit 314(4). Output voltage 310(5) is supplied via a third output channel of voltage regulator circuit 306(2) to a fifth subunit 314(5) and a sixth subunit 314(6).

Figure 5A:
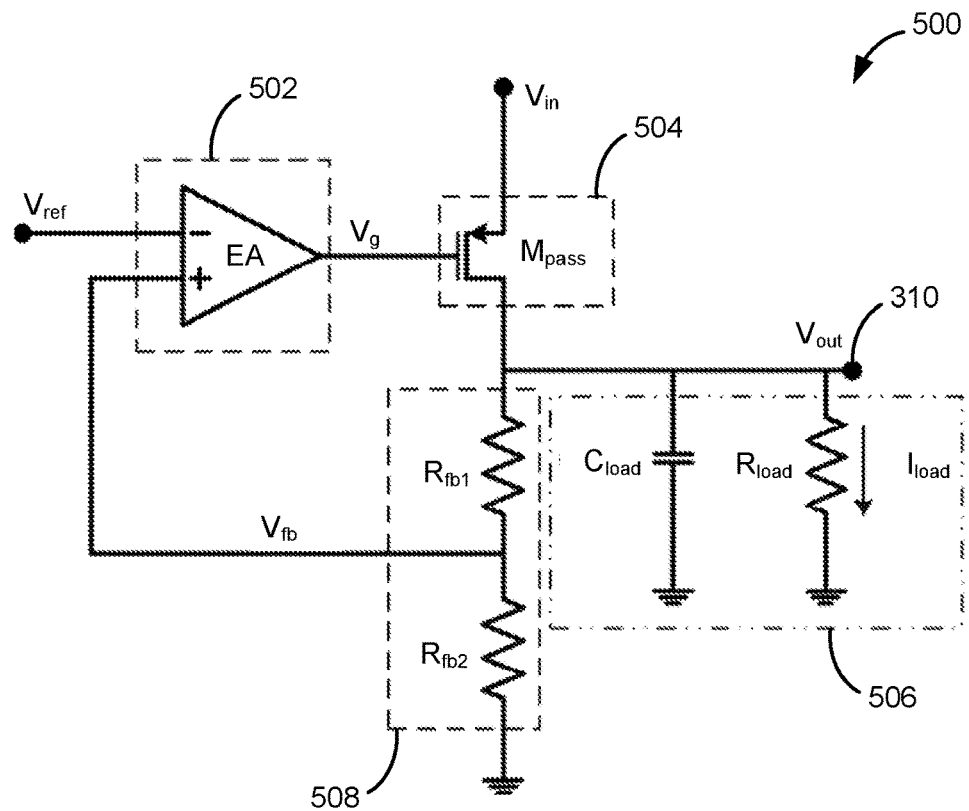
FIG. 5A illustrates a circuit diagram for a low-dropout (LDO) regulator that can be included in the voltage regulator circuit of FIG. 3, according to various embodiments.

FIG. 5A illustrates a circuit diagram for a low-dropout (LDO) regulator 500 that can be included in voltage regulator circuit 306 of FIG. 3, according to various embodiments. As shown in FIG. 5A, LDO 500 includes an error amplifier 502, a pass transistor 504, a load block 506, and a feedback network 508. Each of these components is described in further detail below.

Load block 506 represents a load connected to LDO 500. For example, load block 506 could model the load associated with one or more subunits 314 that are coupled to the output of LDO 500. Load block 506 includes a load denoted by $R_{load}$, a load current denoted by $I_{load}$, and a load capacitance denoted by $C_{load}$.

Pass transistor 504 is denoted by $M_{pass}$ and receives an input voltage $V_{in}$ from a corresponding power plane 304. Pass transistor 504 operates as a pass element between the input voltage and a stable output voltage 310 denoted by $V_{out}$.

Feedback network 508 includes two resistors denoted by $R_{fb1}$ and $R_{fb2}$. Feedback network 508 samples a variation of the output voltage at $V_{fb}$.

Error amplifier 502 compares the sampled voltage $V_{fb}$ with a stable reference voltage $V_{ref}$ and generates an error signal that continuously drives the gate of pass transistor 504 so that a constant output voltage 310 is generated, independent of the input voltage and the load current. This output voltage 310 can be expressed as $V_{out}=(1+R_{fb1}/R_{fb2})V_{ref}$.

Figure 5B:
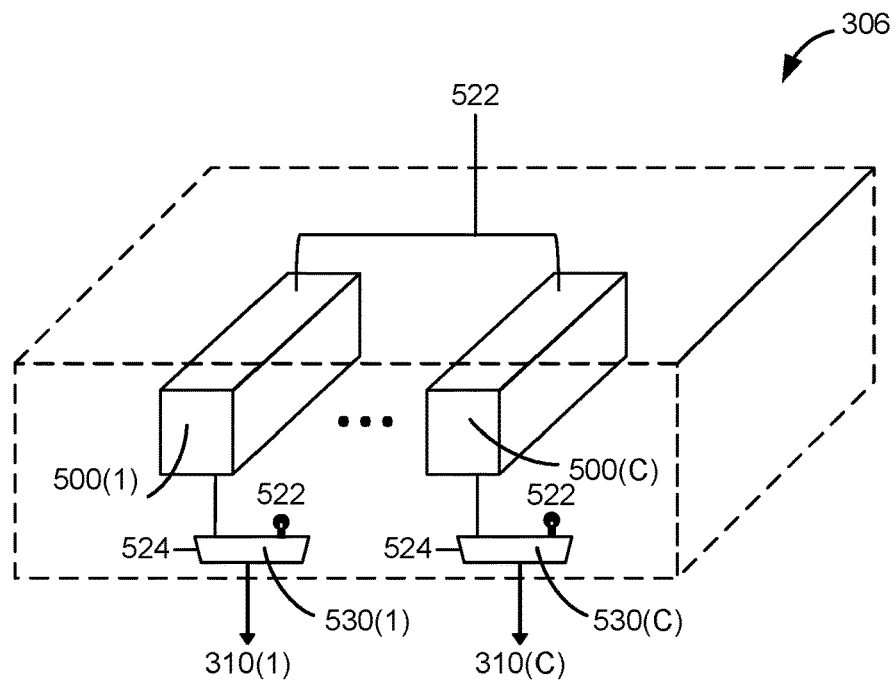
FIG. 5B illustrates an exemplary schematic for the voltage regulator circuit of FIG. 3, according to various embodiments.

FIG. 5B illustrates an exemplary schematic for voltage regulator circuit 306 of FIG. 3, according to various other embodiments. As shown in FIG. 5B, voltage regulator circuit 306 includes a number of LDOs 500(1)-(C) (each of which is referred to individually as LDO 500) that receive an input voltage 522 from a power plane (not shown) and/or another source. The output of each LDO 500 is connected to one input of each of a number of multiplexers (e.g., multiplexers 530(1)-(C), each of which is referred to individually as multiplexer 530). More specifically, the output of LDO 500(1) is connected to one input of multiplexer 530(1), and the output of LDO 500 is connected to one input of multiplexer 530(C).

Each multiplexer 530 also includes another input to which input voltage 522 is connected. A signal 524 received over a select line in each multiplexer 530 is used to select input voltage 522 or the output voltage of the corresponding LDO 500 as an output voltage 310 of that multiplexer 530. For example, a first signal 524 value representing a test mode could be used to configure each multiplexer 530 to forward the output voltage generated by the corresponding LDO 500 to a power plane, subunit, and/or another component connected to the output of that multiplexer 530. A second signal 524 value representing a bypass mode could be used to configure multiplexer 530 to forward input voltage 522 to the component connected to the output of that multiplexer 530.

While the implementation of voltage regulator circuit 306 has been described above with respect to LDOs 500, it will be appreciated that voltage regulator circuit 306 can utilize other types of voltage regulators to convert an input voltage into one or more output voltages 310. For example, voltage regulator circuit 306 could include one or more linear regulators, switching regulators, step-up converters, step-down converters, buck-boost converters, and/or other types of circuits or components that can be used to generate output voltages that are greater than, less than, or equal to an input voltage.

Figure 6:
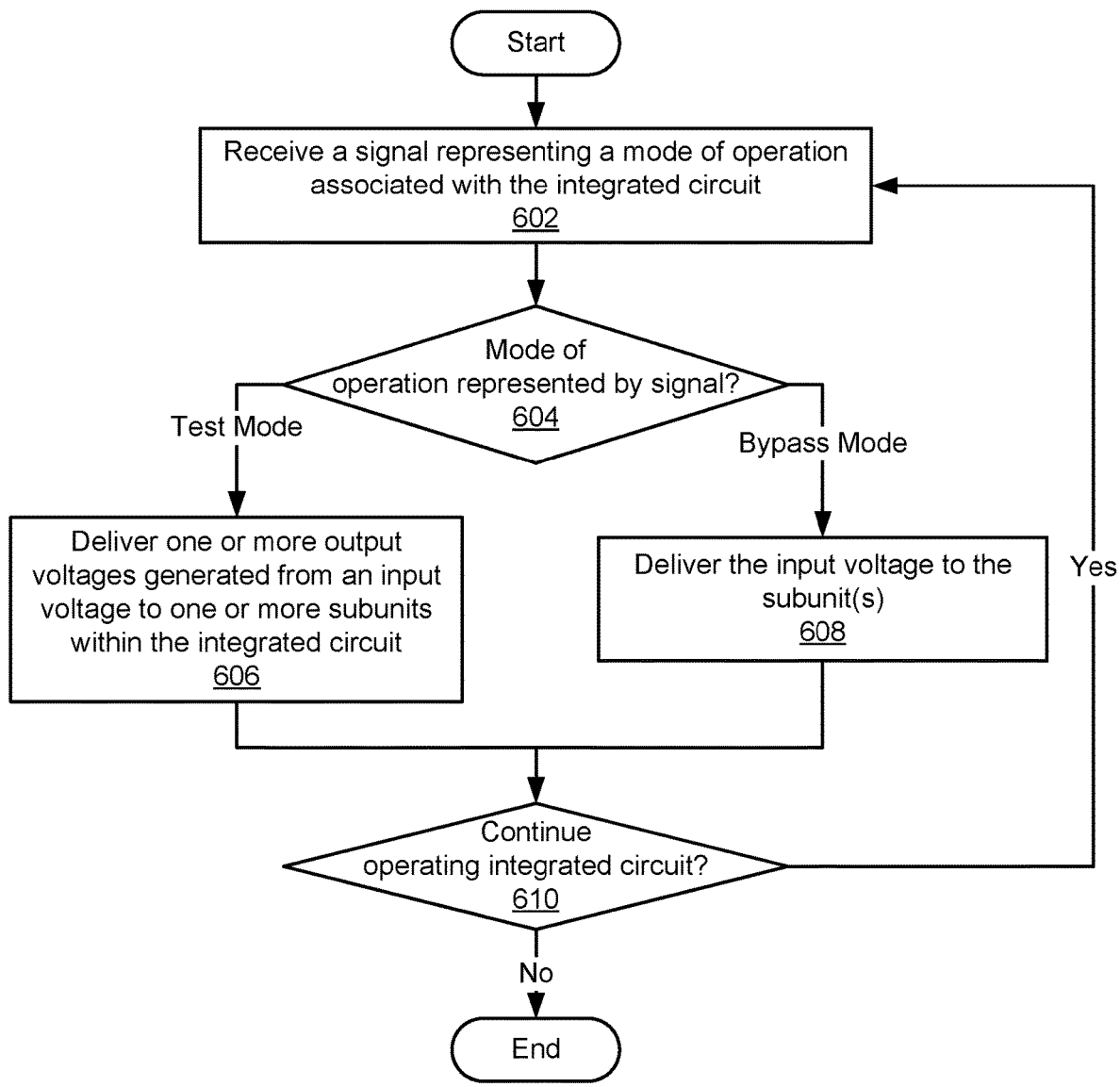
FIG. 6 sets forth a flow diagram of method steps for operating an integrated circuit during testing, according to various embodiments.

FIG. 6 sets forth a flow diagram of method steps for operating an integrated circuit during testing, according to various embodiments. Although the method steps are described in conjunction with the systems of FIGS. 1-5B, persons skilled in the art will understand that any system configured to perform the method steps in any order falls within the scope of the present disclosure.

As shown, voltage regulator circuit 306 receives 602 a signal representing a mode of operation associated with the integrated circuit. For example, voltage regulator circuit 306 could include one or more multiplexers that receive the signal via a select line.

Next, voltage regulator circuit 306 determines 604 the mode of operation represented by the signal. For example, the signal could include one value (e.g., a low value) that represents a test mode and another value (e.g., a high value) that represents a bypass mode.

When the mode of operation represented by the signal corresponds to the test mode, voltage regulator circuit 306 delivers 606 one or more output voltages generated from an input voltage to one or more subunits within the integrated circuit. For example, voltage regulator circuit 306 could include one or more LDOs and/or other types of voltage regulators that convert the input voltage received via a power plane into one or more output voltages. When the signal includes a value that represents the test mode, the signal could cause the multiplexer(s) in voltage regulator circuit 306 to pass the output voltage(s) generated by the voltage regulators to the subunit(s). Each output voltage could include a minimum operating voltage or a maximum operating voltage of the corresponding subunit. Consequently, the output voltages supplied to the subunit(s) during the test mode could be used to increase coverage of faults, defects, and/or other issues in the subunit(s) during a test of the integrated circuit.

When the mode of operation represented by the signal corresponds to the bypass mode, voltage regulator circuit 306 delivers 608 the input voltage to the subunit(s). For example, a signal value corresponding to the bypass mode could cause the multiplexer(s) in voltage regulator circuit 306 to pass the input voltage to the subunit(s), thereby "bypassing" the output voltage(s) generated by LDOs and/or other types of voltage regulators in voltage regulator circuit 306 from the input voltage.

Voltage regulator circuit 306 determines 610 whether or not to continue operating the integrated circuit. For example, voltage regulator circuit 306 could continue operating the integrated circuit while power is supplied to the integrated circuit (e.g., by an ATE, a device that includes the integrated circuit, and/or another external source). While the integrated circuit continues to be operated, voltage regulator circuit 306 repeats operations 602-608 to control the delivery of various voltages to the subunit(s). Voltage regulator circuit 306 can discontinue operating the integrated circuit once power is no longer supplied to the integrated circuit.

In sum, the disclosed techniques include integrated circuit designs that improve voltage-based testing of chips with multiple subunits. Each integrated circuit includes one or more voltage regulator circuits that can be configured to operate in a test mode or in a bypass mode. When a voltage regulator circuit is placed into the test mode, the voltage regulator circuit converts an input voltage supplied by a power pin on an ATE and/or another power source into a number of output voltages. These output voltages are delivered to a set of subunits in the chip to test the operation of the subunits under the corresponding ranges of operating voltages. For example, each voltage regulator circuit could be used to convert a single input voltage supplied from a power pin on an ATE into one or more minimum operating voltages and/or maximum operating voltages associated with a group of subunits that receive power from the power pin.

When a voltage regulator circuit is placed into the bypass mode, the voltage regulator circuit forwards the input voltage to the subunits. For example, the voltage regulator circuit(s) could be placed in the bypass mode after the chip has been verified to meet specifications (e.g., during subsequent packaging, assembly, or use of the chip).

One technical advantage of the disclosed techniques relative to the prior art is that, with the disclosed techniques, a single input test voltage can be converted into multiple output test voltages that are then supplied to multiple subunits within a chip when testing the chip. Notably, the output test voltages can be structured such that the entire range of operating voltages for each subunit within the chip can be tested. Accordingly, the disclosed techniques enable a broader range of defects across the different subunits within a chip to be detected during testing, relative to what can be achieved using prior art approaches. Consequently, the broader-based testing enabled by the disclosed techniques is able to reduce the degradation and failure rates in chips that pass voltage-based tests. These technical advantages provide one or more technological improvements over prior art approaches.

1. In some embodiments, an integrated circuit comprises a plurality of subunits associated with a plurality of operating voltages; and one or more voltage regulator circuits that convert a first input voltage into a first plurality of output voltages during a first test, wherein the first plurality of output voltages is delivered to the plurality of subunits via a plurality of output channels.

2. The integrated circuit of clause 1, wherein the one or more voltage regulator circuits convert a second input voltage into a second plurality of output voltages during a second test, wherein the second plurality of output voltages is delivered to the plurality of subunits via the plurality of output channels.

3. The integrated circuit of any of clauses 1-2, wherein the first plurality of output voltages comprises a plurality of minimum operating voltages for the plurality of subunits and the second plurality of output voltages comprises a plurality of maximum operating voltages for the plurality of subunits.

4. The integrated circuit of any of clauses 1-3, wherein the one or more voltage regulator circuits comprise a first voltage regulator circuit that converts a first output voltage included in the first plurality of output voltages into a second output voltage included in the first plurality of output voltages.

5. The integrated circuit of any of clauses 1-4, wherein, during a bypass mode, the one or more voltage regulator circuits forward a second input voltage to the plurality of subunits.

6. The integrated circuit of any of clauses 1-5, wherein the one or more voltage regulator circuits comprise one or more multiplexers that deliver the first plurality of output voltages to the plurality of subunits in response to a first signal value that represents a test mode associated with the first test.

7. The integrated circuit of any of clauses 1-6, further comprising a power plane that supplies the first input voltage to the one or more voltage regulator circuits.

8. The integrated circuit of any of clauses 1-7, wherein the plurality of subunits comprise at least one of a multi-chip module or a three-dimensional integrated circuit.

9. The integrated circuit of any of clauses 1-8, wherein the plurality of subunits comprises at least one of a logic block, a chiplet, or a die.

10. The integrated circuit of any of clauses 1-9, wherein the one or more voltage regulator circuits comprise a low-dropout regulator.

11. The integrated circuit of any of clauses 1-10, wherein the plurality of output voltages comprises a first output voltage that is delivered to a first subunit included in the plurality of subunits and a second output voltage that is delivered to a second subunit and a third subunit included in the plurality of subunits.

12. In some embodiments, a computer-implemented method for operating an integrated circuit during testing comprises receiving a first signal value representing a test mode associated with the integrated circuit; and in response to the first signal value, delivering a first plurality of output voltages generated from a first input voltage to a plurality of subunits included in the integrated circuit via a plurality of output channels.

13. The computer-implemented method of clause 12, further comprising receiving a second signal value representing a bypass mode associated with the integrated circuit; and in response to the second signal value, delivering a second input voltage to the plurality of subunits via the plurality of output channels.

14. The computer-implemented method of any of clauses 12-13, wherein the first plurality of output voltages and the second input voltage are delivered to the plurality of subunits via one or more multiplexers.

15. The computer-implemented method of any of clauses 12-14, wherein the first plurality of output voltages comprises a plurality of operating voltages for the plurality of subunits.

16. The computer-implemented method of any of clauses 12-15, wherein the first plurality of output voltages comprises a plurality of minimum operating voltages for the plurality of subunits.

17. The computer-implemented method of any of clauses 12-16, wherein the first plurality of output voltages comprises a plurality of maximum operating voltages for the plurality of subunits.

18. The computer-implemented method of any of clauses 12-17, wherein the first plurality of output voltages is generated by one or more voltage regulator circuits.

19. The computer-implemented method of any of clauses 12-18, wherein the one or more voltage regulator circuits comprise a low-dropout regulator.

20. The computer-implemented method of any of clauses 12-19, wherein the plurality of subunits comprises at least one of a logic block, a chiplet, or a die.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. An integrated circuit, comprising:
   a plurality of subunits associated with a plurality of operating voltages; and
   one or more voltage regulator circuits that convert a first input voltage into a first plurality of output voltages during a first test, wherein the first plurality of output voltages is delivered to the plurality of subunits via a plurality of output channels.

2. The integrated circuit of claim 1, wherein the one or more voltage regulator circuits convert a second input voltage into a second plurality of output voltages during a second test, wherein the second plurality of output voltages is delivered to the plurality of subunits via the plurality of output channels.

3. The integrated circuit of claim 2, wherein the first plurality of output voltages comprises a plurality of minimum operating voltages for the plurality of subunits and the second plurality of output voltages comprises a plurality of maximum operating voltages for the plurality of subunits.

4. The integrated circuit of claim 1, wherein the one or more voltage regulator circuits comprise a first voltage regulator circuit that converts a first output voltage included in the first plurality of output voltages into a second output voltage included in the first plurality of output voltages.

5. The integrated circuit of claim 1, wherein, during a bypass mode, the one or more voltage regulator circuits forward a second input voltage to the plurality of subunits.

6. The integrated circuit of claim 1, wherein the one or more voltage regulator circuits comprise one or more multiplexers that deliver the first plurality of output voltages to the plurality of subunits in response to a first signal value that represents a test mode associated with the first test.

7. The integrated circuit of claim 1, further comprising a power plane that supplies the first input voltage to the one or more voltage regulator circuits.

8. The integrated circuit of claim 1, wherein the plurality of subunits comprise at least one of a multi-chip module or a three-dimensional integrated circuit.

9. The integrated circuit of claim 1, wherein the plurality of subunits comprises at least one of a logic block, a chiplet, or a die.

10. The integrated circuit of claim 1, wherein the one or more voltage regulator circuits comprise a low-dropout regulator.

11. The integrated circuit of claim 1, wherein the plurality of output voltages comprises a first output voltage that is delivered to a first subunit included in the plurality of subunits and a second output voltage that is delivered to a second subunit and a third subunit included in the plurality of subunits.

12. A computer-implemented method for operating an integrated circuit during testing, comprising:
    receiving a first signal value representing a test mode associated with the integrated circuit; and
    in response to the first signal value, delivering a first plurality of output voltages generated from a first input voltage to a plurality of subunits included in the integrated circuit via a plurality of output channels.

13. The computer-implemented method of claim 12, further comprising:
    receiving a second signal value representing a bypass mode associated with the integrated circuit; and
    in response to the second signal value, delivering a second input voltage to the plurality of subunits via the plurality of output channels.

14. The computer-implemented method of claim 13, wherein the first plurality of output voltages and the second input voltage are delivered to the plurality of subunits via one or more multiplexers.

15. The computer-implemented method of claim 12, wherein the first plurality of output voltages comprises a plurality of operating voltages for the plurality of subunits.

16. The computer-implemented method of claim 12, wherein the first plurality of output voltages comprises a plurality of minimum operating voltages for the plurality of subunits.

17. The computer-implemented method of claim 12, wherein the first plurality of output voltages comprises a plurality of maximum operating voltages for the plurality of subunits.

18. The computer-implemented method of claim 12, wherein the first plurality of output voltages is generated by one or more voltage regulator circuits.

19. The computer-implemented method of claim 18, wherein the one or more voltage regulator circuits comprise a low-dropout regulator.

20. The computer-implemented method of claim 12, wherein the plurality of subunits comprises at least one of a logic block, a chiplet, or a die.

* * * * *